| United States Patent [19]
Mahoney et al.

[11] 3,982,963
[45] Sept. 28, 1976

[54] SOLAR BATTERY MAINTAINER
[75] Inventors: Edmund J. Mahoney, Billerica; Paul S. Natanson, Lexington, both of Mass.
[73] Assignee: Solar Power Corporation, Braintree, Mass.
[22] Filed: Aug. 5, 1974
[21] Appl. No.: 495,105

[52] U.S. Cl. ................................ 136/89; 250/239
[51] Int. Cl.² ..................................... H01L 31/04
[58] Field of Search ...................... 136/89; 250/239

[56] References Cited
UNITED STATES PATENTS

| | | | |
|---|---|---|---|
| 3,427,459 | 2/1969 | Truffert | 136/89 X |
| 3,457,427 | 7/1969 | Tarneja et al. | 250/239 |

OTHER PUBLICATIONS
G. Raisbeck, "The Solar Battery", Scientific American, Dec. 1955.

Primary Examiner—John H. Mack
Assistant Examiner—Aaron Weisstuch
Attorney, Agent, or Firm—Curtis, Morris & Safford

[57] ABSTRACT

A device for converting Sunlight into electrical energy which can be used to maintain a charge in a battery includes at least one translucent panel having a plurality of individual electrically connected solar cells mounted therein. The translucent panel is mounted in a frame which can support the panel on a mounting surface. This frame includes a peripheral support wall and a panel support surface extending therebetween. The peripheral support wall has an upper edge and the support surface is located at a level below the upper edge of the peripheral wall thereby to support the panel within the confines of the wall.

20 Claims, 4 Drawing Figures

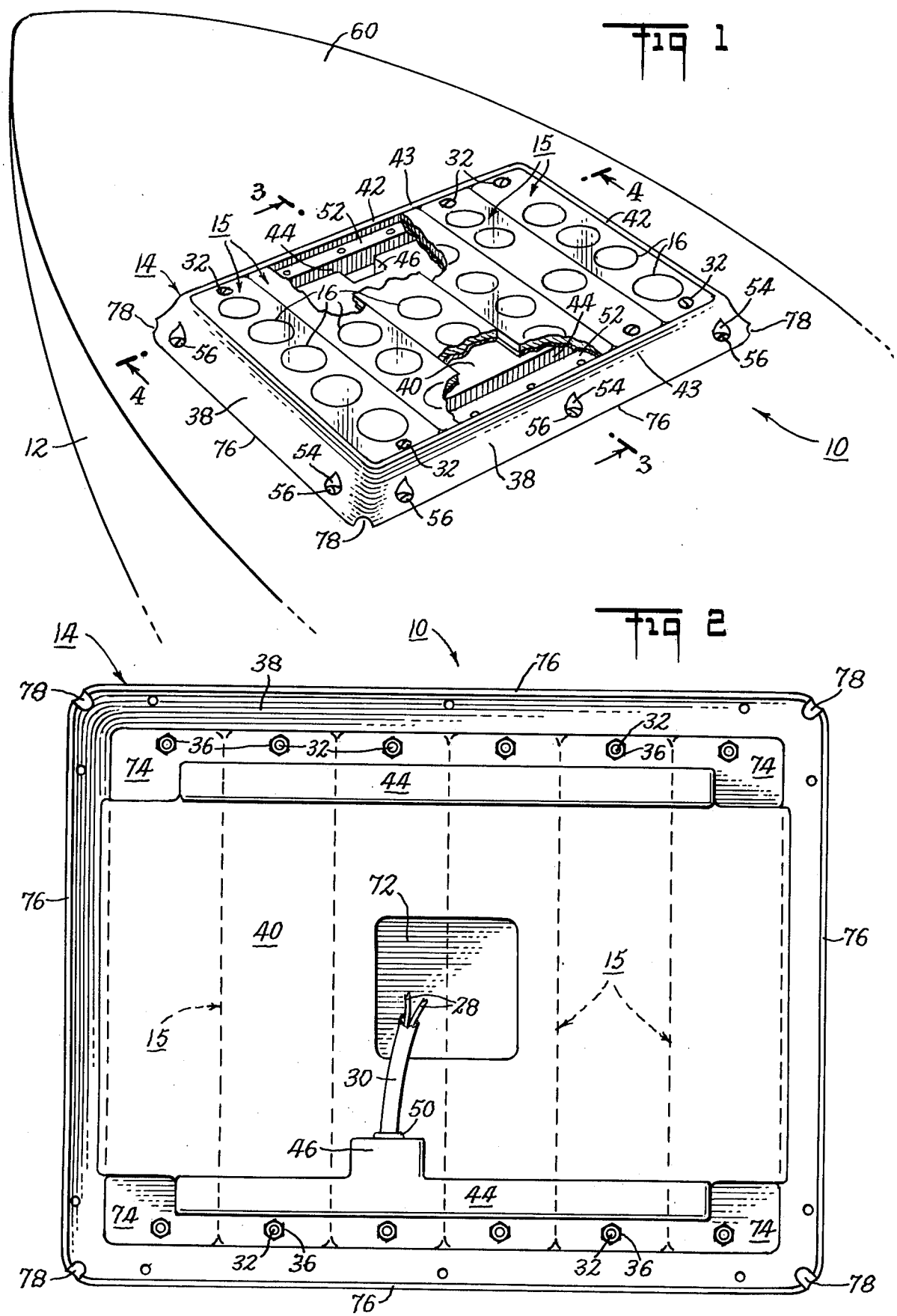

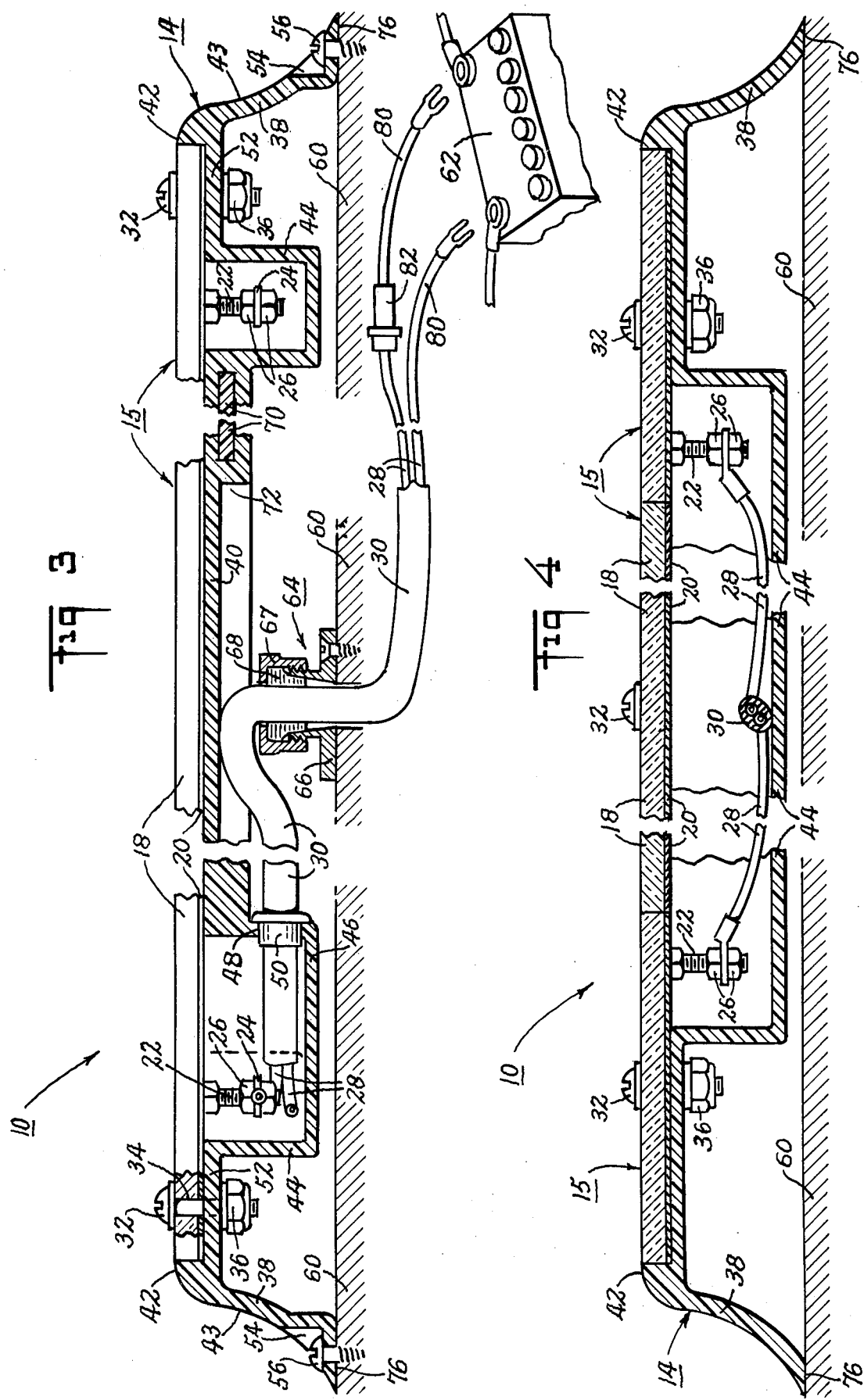

SOLAR BATTERY MAINTAINER

The present invention relates to a device for converting sunlight into electrical energy and more particularly to a device of the character described which is adapted to maintain the charge of an electrical storage device.

With the demand for electrical energy continuously increasing every year, and the simultaneous decrease in energy sources suitable for producing electricity, there is a continuing search for new sources of energy. As a result, solar cells have been developed which can produce electricity from sunlight. Such solar cells typically are semiconductor devices using silicon cells of well known construction, which have demonstrated reliability in space craft power systems. The proved efficiency and the reliability of such solar cell structures makes them extremely appealing for use by the general public as power sources for personal needs. Although the use of solar cells for the production of large amounts of electricity, such as would be required to heat the typical home, is still relatively expensive, the technology in the solar cell art has advanced to the state where solar energy conversion for sepcific uses is now practical.

Accordingly, it is an object of the present invention to provide a compact solar energy conversion unit.

Another object of the present invention is to provide a device which is adapted to be mounted in any convenient location for producing a supply of electricity from sunlight for use in a specific application.

Another object of the present invention is to provide a device which can charge and/or maintain the charge on a battery by the use of solar energy.

Yet another object of the present invention is to provide a solar energy conversion unit which is relatively simple, compact, and economical in construction.

In accordance with one aspect of the present invention a device adapted to convert sunlight into electrical energy which can be used to charge or maintain the charge on a battery and provide a source of energy for certain electrical appliances such as to power radio transceivers or the like, includes a plurality of elongated translucent panels, each having a plurality of individual electrically connected solar cells mounted therein. The panels are electrically connected to each other in series or parallel, depending on the voltage and amperage desired, by individual electrical conductors located adjacent the lower side of the panels, i.e. the side which is not exposed to the sun. An electrical cable is, in turn, connected to the panels to conduct the electric current produced by the solar cells therein from the panels to the battery or load.

The translucent panels are mounted on a frame or case which is adapted to be secured to a mounting surface such as the hatch of a boat or the roof of a house. This frame is generally rectangular in construction and has a peripheral support wall and a panel support surface extending between the wall. The panels are supported on the support surface with the one side thereof engaged against the support surface, between opposite sides of the frame. The support surface has integral channels formed therein below the solar cell panel which receive the conductor elements that interconnect the panels, so that the panels can be substantially completely supported in the frame on the support surface along their entire length. This arrangement will prevent breakage of the panels in the event they are inadvertently stepped on or have a load placed thereon.

The above, and other objects, features, and advantages of the present invention, will be apparent in the following detailed description of an illustrative embodiment thereof which is to be read in connection with the accompanying drawings, wherein:

FIG. 1 is a partial perspective view of a boat having a solar power device constructed in accordance with the present invention mounted thereon;

FIG. 2 is a bottom view of the solar power device shown in FIG. 1;

FIG. 3 is a sectional view taken along lines 3—3 of FIG. 1; and

FIG. 4 is a sectional view taken along lines 4—4 of FIG. 1.

Referring now to the drawings in detail, and initially to FIG. 1 thereof, it will be seen that the solar power device 10 of the present invention is adapted to be mounted, as described hereinafter, on any convenient surface for exposure to the sunlight. In the illustrative embodiment of the invention the device 10 is mounted on the hatch or cabin deck of a boat 12, where it will be fully exposed to the sun to produce electricity for charging the boat's battery or operating a radio transceiver or the like.

Solar energy conversion device 10 includes a frame 14 and a plurality of individual solar modules or panels 15 mounted thereon. Each of these individual modules includes five silicon solar cells or wafers 16 which are wired in series on a glass-reinforced circuit board (not seen in the drawings) which is anchored firmly in an impact resistant and transparent polycarbonate case or plate 18 (FIGS. 3 and 4), so that the cells are exposed to the sunlight. The solar cells in each panel are wired in series and the circuit board on which they are mounted is then encapsulated within the polycarbonate case 18 by a clear silicon rubber backing layer 20 to form mechanically sound panels, each of which is water-tight.

Each panel has a positive and negative terminal respectively located at opposite ends of the panel, with each terminal being connected to a conductive threaded terminal bar or rod 22. These terminals are used to electrically connect the separate panels in series. This is done by the provision of conductors 24 of conventional construction which are secured to the respective terminal rods 22 by a pair of nuts 26, as seen in FIG. 4. The last positive and negative terminals in the series are connected in a similar manner to the ends of a pair of wires 28 in an electrical cable 30 that serves to conduct current formed in the individual solar cells to the battery or load.

Panels 15 are each secured to the frame 14 by a pair of bolts 32 that extend through apertures 34 in the panels and complementary apertures in the frame. The bolts 32 are provided with nuts 36 on their opposite ends to securely fasten the panels to the frame.

As seen in FIG. 1, frame 14 has a generally rectangular configuration and includes a peripheral support wall 38. A panel support wall or surface 40 is formed integrally with the peripheral wall 38 and extends across the entire frame between the wall, as seen in FIGS 2 and 3. The support surface is located at a predetermined distance below the top edge 42 of peripheral wall 38, with this distance being substantially equal to the thickness of the panels 15. In this manner, the panels are fully supported across their entire length by the surface 40, with their upper surfaces loacted at the same level as the upper edge 42 of wall 38, thereby to form a relatively flat and smooth surface across the frame member. This is an important feature of the present invention since it avoids damage to panels 15 as a result of a person walking near the device 10 and tripping over or hitting an edge of a panel in the frame. Moreover, the construction of the present invention permits the device to be mounted in an area where persons on the boat may walk, without danger of the person tripping, since the curved configuration of side wall 38 and the recessed mounting of the panels 15 creates no unexpected blunt surface against which a person can trip.

The support surface 40 is constructed to accommodate the downwardly extending terminals 22 at opposite ends of each panel 15 so as to permit the panels to lie flush against the support surface. That is, as seen in FIGS. 1 and 3, the opposite sides 43 of frame 14 are each provided with elongated recesses or channels 44 which extend below surface 40. These channels are dimensioned to receive the terminals 22 and the conductors 24 extending therebetween. One of the channels 44 includes an extension 46 which accommodates the end of electrical cable 30. The latter extends through an aperture 48 in the extenison 46 to a position below support surface 40.

Preferably cable 30 has an annular rubber plug 50 mounted thereon which is adapted to be inserted into aperture 48 in a friction type fit to clamp the cable in a fixed position at the aperture, thereby to prevent movement of the cable and also to form a liquid-tight seal between the exterior of the frame and the interior of channel 44. In this connection it is noted that the channels 44, and the extension 46, can be potted, i.e. filled with an epoxy resin or other conventional potting material, to completely surround cable 30 and terminals 22, after panels 15 are assembled with the frame. Potting of the channels in this manner completely seals the electrical connections in the frame and makes them watertight. This is particularly important in cases where the device 10 is to be used on a boat or roof of a house wherein it will be exposed to substantial amounts of water.

The channels 44 are located inwardly of the sides 43 of frame 14, thereby to form ledges 52 adjacent the side walls 43. Ledges 52 provide firm support for the ends of the rectangular panels 15, and include apertures therein throughout which the bolts 32 extend, in order to secure the panels to the frame.

As mentioned, frame 14 is adapted to be mounted on the deck of a boat or roof of a house, and for this purpose the support wall 38 is provided with a plurality of apertured recesses 54 through which screws 56 or the like can be inserted for mounting the frame on the mounting surface or deck 60. of the boat 12. It is contemplated that cable 30 will be extended through an aperture in the mounting surface 60 for connection to a battery 62 or the like to which current from the solar cells is to be supplied. Where such a mounting arrangement is used, cable 30 is provided with a conventional deck fitting 64 that guides cable 30 through the mounting surface or the deck.

Fitting 64 includes a first threaded member 66 which is screwed or otherwise secured to mounting surface 60. A collar element 67 surrounds cable 30 (as seen in FIG. 3) and is threaded to member 66. A resilient compression fitting 68 is contained within the collar or cap 67 and surrounds cable 30 in a friction fit. It will be appreciated that upon tightening of collar 67 on mounting element 66, the collar 68 will be compressed to tightly hold the cable in a fixed position at deck 60. This arrangement prevents inadvertent pulling or movement of the cable with respect to the deck and the frame.

The support surface 40 in frame 14 has a predetermined thickness which is selected to provide sufficient structural strength across the frame to permit a person to stand on the solar panels if necessary. While it is contemplated that the entire frame member will be formed from a one piece molded plastic construction, with the desired thicknesses, the thickness of surface 40 can be adjusted by the provision of reinforcing plates or sheets 70 embedded therein. Such sheets might take the form of woven fiberglass, balsa wood blocks, or the like.

It is noted that predetermined portions of surface 40 can have reduced thicknesses in order to accommodate the location of deck mounting elements 64. Thus, for example as seen in FIG. 2, the central portion of the surface 40 can have a small square area 72 of reduced thickness beneath which the deck mounting member 64 is located. Similarly, the corners 74 of the support surface 40 can also have reduced thicknesses to accommodate the deck mounting member 64 at those locations, if the mounting requirements for the particular use of the device indicate that the deck mounting member 64 must be located near the corner of the frame.

Since the device of the present invention is particularly intended for use on boats, the roof of a house, or the like, wherein it is exposed to the water and the elements, the lower edge 76 of the frame's side wall 38 can be provided with a plurality of drainage slots 78 formed therein. These slots would allow any water collecting below the frame to escape therefrom. The slots are formed such that, if necessary, the electrical cable 30 can be extended through one of the slots. In this case the deck mounting 64 will be located outside of the frame rather than beneath the support surface 40, as shown in FIG. 3.

As mentioned above, the device of the present invention is adapted to supply electrical current produced from solar energy or sunlight to a battery in a boat or in a home or the like, in order to charge or maintain the charge in the battery. Thus, as shown in FIG. 3, the ends 80 of the wires in cable 30 can be connected to the appropriate terminals of the battery 62, in any convenient manner. In order to protect the solar cells and the battery a fuse 82 can be electrically connected in one of the wires 28. In addition, the cable 30 is provided with a diode in the conventional manner, to prevent the flow of current from the battery to the solar cells during darkness.

Accordingly, it will be appreciated that the construction of the present invention provides a simple and effective solar power package which is adapted to maintain electrical power in a battery through the conversion of solar energy. The device keeps the battery charged, even when it is unattended, and can be mounted on any surface exposed to the sunlight for a major portion of the day. It will be appreciated that the frame structure of the device and the mounting arrangement for the individual panels 15 is rigid and has a high structural strength. It is particularly suitable for nautical use and the solar cells mounted in the panels are impervious to water and atmoshperic gases and particles. Since there are no moving parts in the device it is maintenance-free and once connected to the battery it will operate continuously to automatically restore power drained from the battery during use. Moreover, since the solar cells continuously produce current when exposed to sunlight, in the event of a power failure that current can be used to operate an electrical appliance, such as for example a radio or a bilge pump.

It also will be appreciated that the construction of the present invention is suitable for many applications and can be provided in numerous sizes to accommodate one or more individual panels 15. The number of panels required for a particular application is selected in accordance with the amount of daily sunshine available in the location in which it is to be used, with consideration given to the weather, season and atmoshperic conditions in the area of use. In the illustrative embodiment of the invention, wherein six individual panels 15 are used, each including five silicon solar cells, the device can maintain a charge on a typical 12volt boat battery, and produce enough current to operate a 3 to 5 watt radio directly from the sun. Of course, if more power is required, a larger size frame is used and the number of panels 15 is increased. These may be wired in series and/or in parallel to give the desired power at proper voltage and current levels.

Although an illustrative embodiment of the present invention has been described with reference to the accompanying drawings, it is to be understood that the invention is not limited to that precise embodiment and that various changes and modifications may be effected therein by one skilled in the art without departing from the scope or spirit of the invention.

What is claimed is:

1. A device for use in converting sunlight into electrical energy comprising at least one translucent panel having a plurality of individual electrically connected solar cells mounted therein and an electrical cable connected to said solar cells for conducting electric current therefrom, and means for supporting said panel on a mounting surface including a frame having a peripheral support wall and a panel support surface extending therebetween, said support wall having an upper edge and said support surface being located below said upper edge to support said panel within the confines of said peripheral wall; said frame including means for draining water entering below said support surface and between said support wall from the confines of the frame.

2. The device as defined in claim 1 wherein said panel has a predetermined thickness and said support surface is located below said upper edge a distance equal to said predetermined thickness whereby said panel is flush with said upper edge.

3. A device for use in converting sunlight into electrical energy comprising a plurality of translucent panels, wherein each of said panels has a plurality of individual electrically connected solar cells mounted therein and is electrically connected to an adjacent panel by an electrical conductor located below the panels; an electrical cable connected to said solar cells for conducting electric current therefrom, and means for supporting said panel on a mounting surface including a frame having a peripheral support wall and a panel support surface extending therebetween, said support wall having an upper edge and said support surface being located below said upper edge to support said panels within the confines of said peripheral wall; said support surface supporting said panels within said peripheral wall and having recesses formed therein which accommodate said electrical conductors located below said panels and adjacent the support surface of the frame, whereby said panels lie flat against said support surface.

4. The device as defined in claims 3 wherein said recesses are filled with a potting material to encase and waterproof said electrical conductors.

5. The device as defined in claim 3 wherein said support frame has rounded edges and a low profile, thereby to reduce possibility of injury by toe stubbing or tripping.

6. A device for use in converting sunlight into electrical energy comprising a plurality of translucent panels, wherein each of said panels has a plurality of individual electrically connected solar cells mounted therein and is electrically connected to an adjacent panel by an electrical conductor located below the panels; an electrical cable connected to said solar cells for conducting electric current therefrom, and means for supporting said panel on a mounting surface including a frame having a peripheral support wall and a panel support surface extending therebetween, said support wall having an upper edge and said support surface being located below said upper edge to support said panels within the confines of said peripheral wall; said support surface supporting said panels within said peripheral wall and having recesses formed therein which accommodate said electrical conductors located below said panels and adjacent the support surface of the frame, whereby said panels lie flat against said support surface; said support surface having a predetermined thickness, said electrical cable including cable guide means for securing the cable in a fixed position with respect to said mounting surface, said support surface having at least one area of reduced thickness formed therein for accommodating said cable guide means below the support surface.

7. A device for use in converting sunlight into electrical energy comprising at least one translucent panel having a plurality of individual electrically connected solar cells mounted therein and an electrical cable connected to said solar cells for conducting electric current therefrom, and means for supporting said panel on a mounting surface including a frame having a peripheral support wall and a panel support surface extending therebetween, said support wall having upper and lower edges and said support surface being located below said upper edge to support said panel within the confines of said peripheral wall; said lower edge of said support wall being adapted to engage said mounting surface, said lower edge having at least one drainage port formed therein to allow drainage of water entering below said support surface and between said support wall.

8. A device for use in converting sunlight into electrical energy comprising a plurality of translucent panels, wherein each of said panels has a plurality of individual electrically connected solar cells mounted therein and is electrically connected to an adjacent panel by an electrical conductor located below the panels; an electrical cable connected to said solar cells for conducting electric current therefrom, and means for supporting said panel on a mounting surface including a frame having a peripheral support wall and a panel support surface extending therebetween, said support wall having an upper edge and said support surface being located below said upper edge to support said panels within the confines of said peripheral wall; said support surface supporting said panels within said peripheral wall and having recesses formed therein which accommodate said electrical conductors located below said panels and adjacent the support surface of the frame, whereby said panels lie flat against said support surface; said panels each having substantially the same predetermined thickness and said support surface being located below said upper edge of said support wall a distance equal to said predetermined thickness whereby said panels are substantially flush with said upper edge.

9. A device for use in converting sunlight into electrical energy comprising a plurality of elongated translucent panels each having a plurality of individual electrically connected solar cells mounted therein, said panels being electrically connected in series by individual electrical conductors located adjacent one side of the panels; and an electrical cable operatively connected to the panels adjacent said one side thereof for conducting electric current from the panels; and means for supporting said panels on a mounting surface including a generally rectangular frame having a peripheral support wall and a panel support surface extending therebetween, said panels being supported on said support surface with said one side thereof engaged with the support surface and extending between one pair of opposite sides of the frame, said individual electrical conductors connecting said panels adjacent said opposite sides, said support surface having a pair of integral channels formed therein adjacent said opposite sides, said channels extending away from said panels and receiving said conductors therein to allow the panels to be substantially completely supported in said frame with said one side thereof on said support surface.

10. The device as defined in claim 9 wherein said peripheral support wall has an upper edge and said support surface is located a predetermined distance below said upper edge to support said panel within the confines of said peripheral wall.

11. The device as defined in claim 9 wherein said panels have predetermined thicknesses and widths, said support surface being located below said upper edge a distance equal to said predetermined distance whereby said panels are flush with said upper edge and said panels completely cover said support surface between opposite sides of said peripheral wall.

12. The device as defined in claim 9 wherein said channels are filled with potting material to the level of said support surface to encase and waterproof said electrical conductors.

13. The device as defined in claim 9 wherein said peripheral wall has a lower edge and said support surface is located a predetermined distance above said lower edge, said support surface having a predetermined thickness selected to allow walking on said panels without damage thereto.

14. The device as defined in claim 9 wherein said frame is formed of an impact-resistant material.

15. The device as defined in claim 14 wherein said impact resistant material is fiberglass.

16. A device for use in converting sunlight into electrical energy comprising a plurality of elongated translucent panels, each having a plurality of individual electrically connected solar cells mounted therein, said panels being electrically connected in series by individual electrical conductors located adjacent one side of the panels; and an electrical cable operatively connected to the panels adjacent said one side thereof for conducting electric current from the panels; and means for supporting said panels on a mounting surface including a generally rectangular frame having a peripheral support wall and a panel support surface extending therebetween, said panels being supported on said support surface with said one side thereof engaged with the support surface and extending between one pair of opposite sides of the frame, said individual electrical conductors connecting said panels adjacent said opposite sides, said support surface having a pair of integral channels formed therein adjacent said opposite sides, said channels extending away from said panels and receiving said conductors therein to allow the panels to be substantially completely supported in said frame with said one side thereof on said support surface; said electrical cable including cable guide means for securing the cable in a fixed position with respect to said mounting surface, said support surface having at least one area of reduced thickness formed therein for accommodating said cable guide means below the support surface.

17. The device as defined in claim 16 wherein said peripheral support wall includes a lower edge adapted to engage said mounting surface, said lower edge having at least one drainage port formed therein to allow drainage of water entering below said support surface and between said support wall.

18. The device as defined in claim 17 including means for securing said panels to said support surface within said wall.

19. The device as defined in claim 17 wherein one of said channels has an aperture formed therein and said electrical cable extends through said aperture, and plug means in said aperture for holding the cable against movement therein and for creating a water-tight seal between the cable and the channel.

20. A device for use in converting sunlight into electrical energy comprising a plurality of elongated translucent panels, each having a plurality of individual electrically connected solar cells mounted therein, said panels being electrically connected in series by individual electrical conductors located adjacent one side of the panels; and an electrical cable operatively connected to the panels adjacent said one side thereof for conducting electric current from the panels; and means for supporting said panels on a mounting surface including a generally rectangular frame having a peripheral support wall and a panel support surface extending therebetween, said panels being supported on said support surface with said one side thereof engaged with the support surface and extending between one pair of opposite sides of the frame, said individual electrical conductors connecting said panels adjacent said opposite sides, said support surface having a pair of integral channels formed therein adjacent said opposite sides, said channels extending away from said panels and receiving said conductors therein to allow the panels to be substantially completely supported in said frame with said one side thereof on said support surface; said frame including means for draining water from the frame entering below the support surface and between the support wall.

\* \* \* \* \*